United States Patent [19]
Seo et al.

[11] Patent Number: 5,981,324
[45] Date of Patent: Nov. 9, 1999

[54] METHODS OF FORMING INTEGRATED CIRCUITS HAVING MEMORY CELL ARRAYS AND PERIPHERAL CIRCUITS THEREIN

[75] Inventors: Young-woo Seo; Young-pil Kim, both of Kyungki-do; Myeon-koo Kang; Won-shik Lee, both of Seoul, all of Rep. of Korea

[73] Assignee: Samsung Electronics Co., Ltd., Rep. of Korea

[21] Appl. No.: 08/956,584

[22] Filed: Oct. 23, 1997

[30] Foreign Application Priority Data

Oct. 23, 1996 [KR] Rep. of Korea ............... 96-47802
Oct. 31, 1996 [KR] Rep. of Korea ............... 96-51495

[51] Int. Cl.$^6$ .................................... H01L 21/8242
[52] U.S. Cl. .................... 438/210; 438/231; 438/683
[58] Field of Search .................... 438/200, 210, 438/230, 231, 232, 250, 251, 649, 683

[56] References Cited

U.S. PATENT DOCUMENTS

| | | | |
|---|---|---|---|
| 4,277,882 | 7/1981 | Crossley | 29/571 |
| 4,716,126 | 12/1987 | Cogan | 437/24 |
| 5,187,122 | 2/1993 | Bonis | 438/210 |
| 5,194,929 | 3/1993 | Ohshima et al. | 257/326 |
| 5,198,386 | 3/1993 | Gonzalez | 437/52 |
| 5,250,832 | 10/1993 | Murai | 257/306 |
| 5,276,346 | 1/1994 | Iwai et al. | 257/360 |
| 5,320,976 | 6/1994 | Chin et al. | 438/210 |
| 5,389,558 | 2/1995 | Suwanai et al. | 437/52 |
| 5,395,784 | 3/1995 | Lu et al. | 437/52 |
| 5,569,616 | 10/1996 | Ohki et al. | 437/44 |
| 5,624,863 | 4/1997 | Helm et al. | 438/210 |
| 5,770,497 | 6/1998 | Wu et al. | 438/238 |
| 5,783,470 | 7/1998 | Rostoker | 438/251 |
| 5,801,065 | 9/1998 | Rizvi et al. | 437/60 |

OTHER PUBLICATIONS

B. Davari et al., A High Performance 0.25 $\mu$m CMOS Technology, IEDM, 1988 IEEE, pp. 56–59.

*Primary Examiner*—Chandra Chaudhari
*Attorney, Agent, or Firm*—Myers Bigel Sibley & Sajovec

[57] ABSTRACT

Methods of forming integrated circuits having memory cell arrays therein and peripheral circuits therein include the steps of selectively forming more lightly doped source and drain regions for transistors in the memory cell arrays. These more lightly doped source and drain regions are designed to have fewer crystalline defects therein caused by ion implantation, so that storage capacitors coupled thereto have improved refresh characteristics. Preferred methods include the steps of forming a first well region of first conductivity type (e.g., P-type) in a memory cell portion of a semiconductor substrate and a second well region of first conductivity type in a peripheral circuit portion of the semiconductor substrate extending adjacent the memory cell portion. First and second insulated gate electrodes are then formed on the first and second well regions, respectively, using conventional techniques. First dopants of second conductivity type are then implanted at a first dose level into the first and second well regions, using the first and second insulated gate electrodes as an implant mask. These dopants are then diffused to form lightly doped source and drain regions adjacent the first and second insulated gate electrodes. Second dopants of second conductivity type are then selectively implanted at a second dose level, greater than the first dose level, into the second well region using self-alignment techniques. However, these dopants are preferably not implanted into the first well region. These second dopants are then diffused into the second source/drain regions.

14 Claims, 4 Drawing Sheets

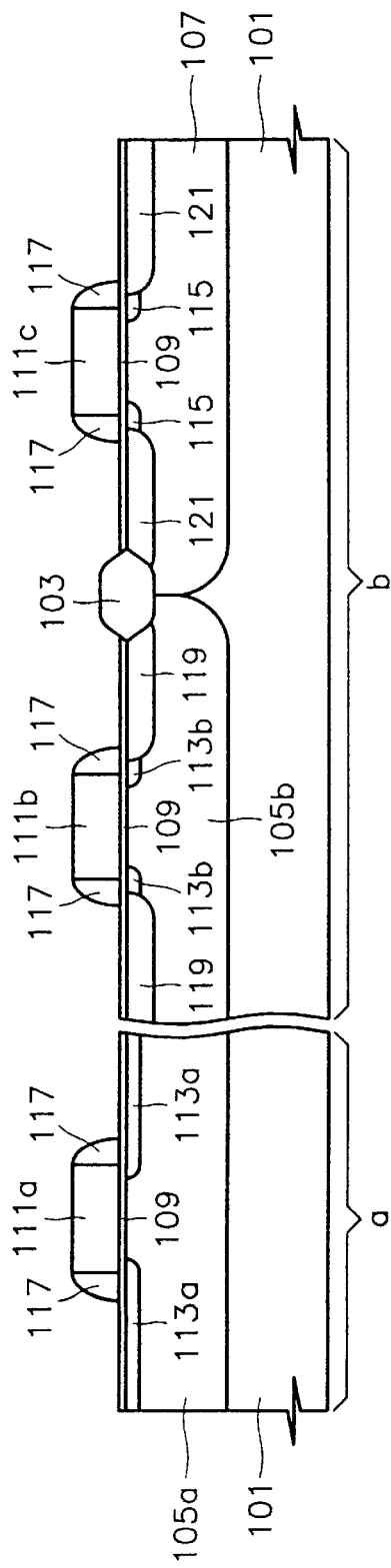
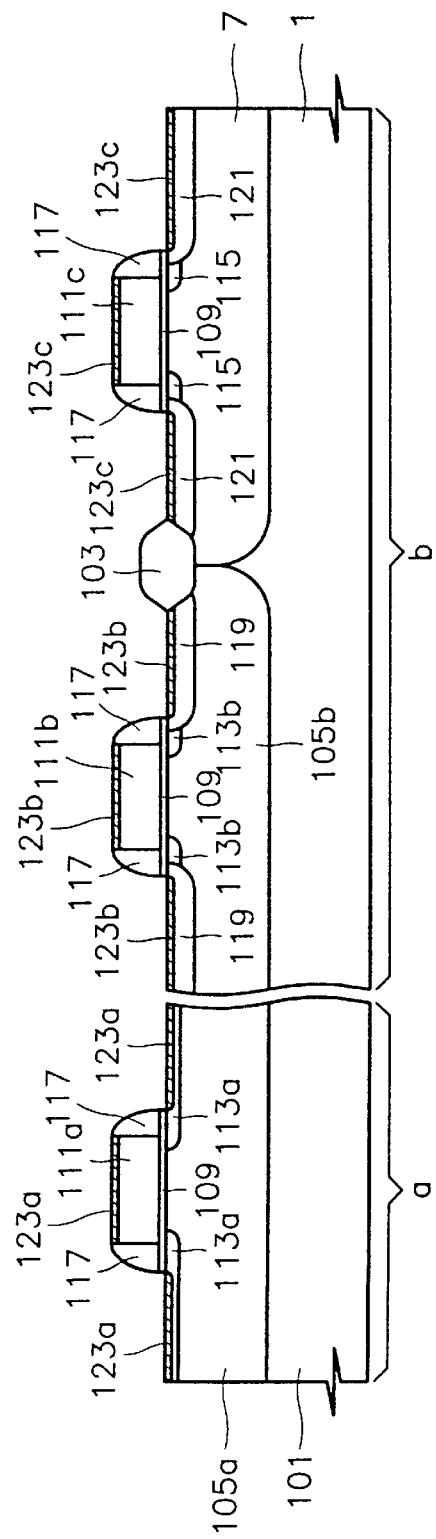

ns/cm². However, if the arsenic ions are ion-implanted at a high

METHODS OF FORMING INTEGRATED CIRCUITS HAVING MEMORY CELL ARRAYS AND PERIPHERAL CIRCUITS THEREIN

CROSS-REFERENCE TO RELATED APPLICATIONS

This application is related to application Ser. No. 08/773,195, entitled METHODS OF FORMING INTEGRATED CIRCUIT MEMORY DEVICES HAVING IMPROVED STORAGE ELECTRODE CONTACT REGIONS THEREIN (Attorney Docket No. 5649-171), filed Dec. 30, 1996; application Ser. No. 08/764,202 entitled METHODS OF FORMING INTEGRATED CIRCUIT MEMORY DEVICES HAVING IMPROVED BIT LINE AND STORAGE ELECTRODE CONTACT REGIONS THEREIN (Attorney Docket No. 5649-189), filed Dec. 13, 1996; and application Ser. No. 08/846,075 entitled METHODS OF FORMING INTEGRATED CIRCUIT MEMORY DEVICES HAVING DEEP STORAGE ELECTRODE CONTACT REGIONS THEREIN FOR IMPROVING REFRESH CHARACTERISTICS (Attorney Docket No. 5649-286), filed Apr. 25, 1997, the disclosures of which are hereby incorporated herein by reference.

FIELD OF THE INVENTION

The present invention relates to methods of forming integrated circuits, and more particularly to methods of forming integrated circuits having memory cell arrays therein.

BACKGROUND OF THE INVENTION

As computers and electrical appliances are gradually miniaturized, the performance characteristics of semiconductor devices, such as operational speed or noise margin, become very important considerations in achieving continued miniaturization. Accordingly, embedded memory logic devices have been developed in which functions of a logic device and a memory device are combined. The embedded memory logic device may be composed of a cell array region in which a multitude of memory cells are positioned and a logic circuit region which operates on the information stored in the cell array region. In order to improve the operational speed of embedded memory logic devices, self-aligned silicide (salicide) processing technology has been developed for selectively forming a metal silicide film having low resistivity on a gate electrode and source/drain region of a transistor. Complementary MOS (CMOS) circuits are also widely used for improving power consumption characteristics of a semiconductor device. In this case, when the gate electrodes of the NMOS transistor and PMOS transistor are both doped with N-type impurities, a buried channel is formed in the channel region of the PMOS transistor whereas a surface channel is formed in the channel region of the NMOS transistor. The PMOS transistor in which the buried channel is formed may exhibit severe short-channel characteristics which make it difficult to reduce the channel length as compared with the NMOS transistor. Accordingly, methods have been proposed for improving the short-channel characteristics of PMOS transistors as well as NMOS transistors by doping N-type and P-type impurities into the gate electrodes of the NMOS transistor and PMOS transistor, respectively.

FIGS. 1 through 3 are sectional views for explaining a conventional method for fabricating transistors of an embedded memory logic device, in which reference characters "a" and "b" denote a cell array region and a logic circuit region, respectively.

FIG. 1 is a sectional view illustrating a step of forming a gate oxide film 9 and a conductive film 11. First, a P-well region and an N-well region 7 are formed over the main surface of a semiconductor substrate 1 using a conventional twin well forming process. Here, the P-well region is divided into a first P-well region 5a and a second P-well region 5b. The first P-well region 5a is formed in a cell array region (a) in which memory cells are formed, and the second P-well region 5b and the N-well region 7 are formed in a logic circuit region (b). Next, an isolation film 3 defining an active region and a field region is formed in a predetermined area of the resultant structure, and a gate oxide film 9 is formed on the active region. Subsequently, an undoped polysilicon film 11 is formed over the entire surface of the resultant structure having the gate oxide film 9 formed therein.

FIG. 2 is a sectional view illustrating a step of forming first, second and third gate patterns 11a, 11b and 11c, a source/drain region of a cell transistor, and source/drain regions of an NMOS transistor and a PMOS transistor of the logic circuit region. In detail, the undoped polysilicon film 11 is patterned to form a first gate pattern 11a on a predetermined area of the gate oxide film 9 formed on the first P-well region 5a. At the same time, second and third gate patterns 11b and 11b are formed on predetermined areas of the gate oxide film 9 formed on the second P-well region 5b and the N-well region 7, respectively. Then, the first and second gate patterns 11a and 11b and the isolation film 3 are used as ion implantation masks and N-type impurities are selectively ion-implanted into the first and second P-well regions 5a and 5b. The implanted N-type impurities are then thermally treated to form a first low-concentration source/drain region 13a and a second low-concentration source/drain region 13b on the surface of the active region in both sides of the first and second gate patterns 11a and 11b, respectively. Here, the first and second low-concentration regions 13a and 13b have doping concentrations in a range from between about $1.0 \times 10^{17}/cm^3$ to $1.0 \times 10^{18}/cm^3$. Next, the third gate pattern 11c and the isolation film 3 are used as ion implantation masks and P-type impurities are selectively ion-implanted into the N-well region 7. A thermal treatment step may also be performed at a predetermined temperature to form a third low-concentration source/drain region 15 on the surface of the active region adjacent both sides of the third gate pattern 11c. Here, the P-type doping concentration in the third low-concentration region may range from about $1.0 \times 10^{17}/cm^3$ to $1.0 \times 10^{18}/cm^3$.

Now, a CVD oxide film is formed over the entire surface of the resultant structure and is anisotropically etched to form spacers 16 at the sidewalls of the first through third gate patterns 11a, 11b and 11c. Next, the spacers 16, the first and second gate patterns 11a and 11b, and the isolation film 3 are used as ion implantation masks and N-type impurities (e.g., arsenic ions) are selectively ion-implanted into the first and second P-well regions 5a and 5b. A thermal treatment step is then performed at a predetermined temperature to form first and second relatively high-concentration source/drain regions 17a and 17b in the first and second low-concentration source/drain regions 13a and 13b. Here, the first and second high-concentration source/drain regions 17a and 17b have a doping concentration in a range from about $1.0 \times 10^{19}$ to $1.0 \times 10^{21}/cm^3$. In this case, in order to dope the first and second high-concentration source/drain regions 17a and 17b at a concentration exceeding $1.0 \times 10^{19}/cm^3$, as described above, the arsenic ions typically must be ion-implanted at a high dose of about $1.0 \times 10^{15}$–$5.0 \times 10^{15}$ ions/cm². However, if the arsenic ions are ion-implanted at a high dose level, ion implantation damage may be generated in the first and second high-concentration source/drain regions 17a and 17b. This implant damage may take the form of crystalline defects such as dislocation defects. Unfortunately, such crystalline defects may not be completely eliminated by subsequent thermal treatment steps. Therefore, junction leakage current may increase between the first and second high-concentration source/drain regions 17a and 17b, and the first and second P-well regions 5a and 5b.

After forming the first and second high-concentration source/drain regions 17a and 17b, as shown, the first and second low-concentration source/drain regions 13a and 13b remain under the spacers 16 formed at the sidewalls of the first and second gate patterns 11a and 11b. As will be understood by those skilled in the art, the remaining first low-concentration source/drain region 13a and the first high-concentration source/drain region 17a in contact therewith constitute a lightly doped drain (LDD) type source/drain region of the cell transistor in the cell array region (a). Also, the remaining second low-concentration source/drain region 13b and the second high-concentration source/drain region 17b in contact therewith constitute a lightly doped drain (LDD) type source/drain region of the NMOS transistor in the logic circuit region (b).

Subsequently, the spacers 16, the third gate pattern 11c and the isolation film 3 are used as ion implantation masks and P-type impurities are selectively ion-implanted into the N-well region 7. These P-type impurities are then thermally treated to cause the formation of third P-type high-concentration source/drain regions 19 (doped to a concentration of $1.0 \times 10^{19} \sim 1.0 \times 10^{21}/cm^3$) in the third low-concentration source/drain region 15. After forming the third high-concentration source/drain regions 19, as shown, the third low-concentration source/drain regions 15 remain under the spacers 16 formed at the sidewalls of the third gate pattern 11c. Here, the remaining third low-concentration source/drain region 15 and the third high-concentration source/drain region 19 being in contact therewith constitute a lightly doped drain (LDD) type source/drain region of the PMOS transistor in the logic circuit region (b).

FIG. 3 is a sectional view illustrating a step of forming first through third titanium (Ti) silicide films 21a, 21b and 21c using a salicide process. In more detail, the gate oxide layer 9 is entirely blanket-oxide-etched to expose first through third high-concentration source/drain regions 17a, 17b and 19. In this case, since the thickness of the gate oxide film 9 is much thinner than that of the spacers 16, the height and width of the spacer 16 change little during the etching step. The natural oxide film on the first through third gate patterns 11a, 11b and 11c is also removed to expose the top surface of the first through third gate patterns 11a, 11b and 11c. Subsequently, a Ti film is formed to a thickness of about 200 Å over the resultant structure and is annealed under a nitrogen atmosphere. In such a manner, if the Ti film is annealed, a first Ti silicide film 21a is formed on the first gate pattern 11a and the first high-concentration source/drain regions 17a and at the same time a second Ti silicide film 21b is formed on the second gate pattern 11b and the second high-concentration source/drain regions 17b. Also, a third Ti silicide film 21c is selectively formed on the third gate pattern 11c and on the third high-concentration source/drain regions 19. In this case, the Ti film formed on the spacers 16 and isolation film 3 remains in an unreacted state. Next, the unreacted Ti film is removed to isolate the gate patterns 11a, 11b and 11c from the neighboring source/drain regions. The unreacted Ti film may be removed using a $NH_4OH$ solution. Alternatively, if tantalum is used as a refractory metal, $H_2SO_4$ may be used.

Next, although not shown, an interlayer insulating film is formed on the resultant structure and a bit line connected to the source region (or the drain region) of the cell transistor is formed. Then, a planarized insulating film is formed over the entire surface of the resultant structure where the bit line is formed, and a cell capacitor comprising a storage electrode connected to the drain region (or the source region) of the cell transistor, a dielectric film and a plate electrode, is formed, thereby completing a DRAM cell in the cell array region (a).

According to the aforementioned conventional method of fabricating transistors, crystalline defects occur in the first and second high-concentration source/drain regions and these defects can increase junction leakage current. Therefore, charges stored in the storage electrode of the cell capacitor may be readily depleted through leakages and this may cause malfunction of the semiconductor device. To prevent malfunction, short cycle refresh times may be required to "recharge" the storage electrodes, however, such short cycle refresh times lead to increased power consumption.

SUMMARY OF THE INVENTION

It is therefore an object of the present invention to provide improved methods of forming integrated circuit memory devices.

It is another object of the present invention to provide methods of forming memory devices having improved refresh characteristics.

It is still another object of the present invention to provide methods of forming memory devices that are less susceptible to ion implant damage.

These and other objects, advantages and features of the present invention are provided by methods of forming integrated circuits having memory cell arrays therein and peripheral circuits therein at adjacent locations in a semiconductor substrate. These preferred methods include the steps of selectively forming more lightly doped source and drain regions for transistors in the memory cell arrays. These more lightly doped source and drain regions are designed to have fewer crystalline defects therein caused by ion implantation, so that storage capacitors coupled thereto have improved refresh characteristics. In particular, preferred methods include the steps of forming a first well region of first conductivity type (e.g., P-type) in a memory cell portion of a semiconductor substrate and a second well region of first conductivity type in a peripheral circuit portion of the semiconductor substrate extending adjacent the memory cell portion. First and second insulated gate electrodes are then formed on the first and second well regions, respectively, using conventional techniques. First dopants of second conductivity type are then implanted at a first dose level into the first and second well regions, using the first and second insulated gate electrodes as an implant mask. These dopants are then diffused to form lightly doped source and drain regions adjacent the first and second insulated gate electrodes. Insulating spacers are then formed on sidewalls of the first and second insulated gate electrodes. Second dopants of second conductivity type are then selectively implanted at a second dose level, greater than the first dose level, into the second well region using self-alignment techniques. However, these dopants are preferably not implanted into the first well region. These second dopants are then diffused into the second source/drain regions. According to a preferred aspect of the present invention, a layer of refractory metal is then formed on the first and second insulated gate electrodes and on the first and second source/drain regions having different doping concentrations therein. The layer of refractory metal is then converted to a layer of refractory metal silicide having low resistance.

According to one embodiment of the present invention, the step of diffusing the first dopants comprises diffusing the first dopants to form first and second source/drain regions having first conductivity type doping concentrations therein in a range between $1 \times 10^{17}$ cm$^{-3}$ and $1 \times 10^{18}$ cm$^{-3}$ and the step of diffusing the second dopants comprises diffusing the second dopants into the second source/drain regions to increase the first conductivity type doping concentrations therein to a level in a higher range between $1 \times 10^{19}$ cm$^{-3}$ and $1 \times 10^{21}$ cm$^{-3}$. The converting step may also be followed by the step of exposing the layer of refractory metal silicide to a solution containing ammonium hydroxide to remove unreacted portions of the refractory metal layer. Thus, according to the present invention, the refresh characteristics of storage capacitors formed in the memory cell array portion of the substrate can be improved by reducing the degree of implant damage in the source and drain regions to which the storage capacitors are coupled. Also, refractory metal suicide layers can be used to reduce RC signal delay throughout the integrated circuit.

BRIEF DESCRIPTION OF THE DRAWINGS

FIGS. 4–7 are cross-sectional views of intermediate structures that illustrate a method of forming an integrated circuit having memory cell arrays and peripheral circuits therein according to an embodiment of the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
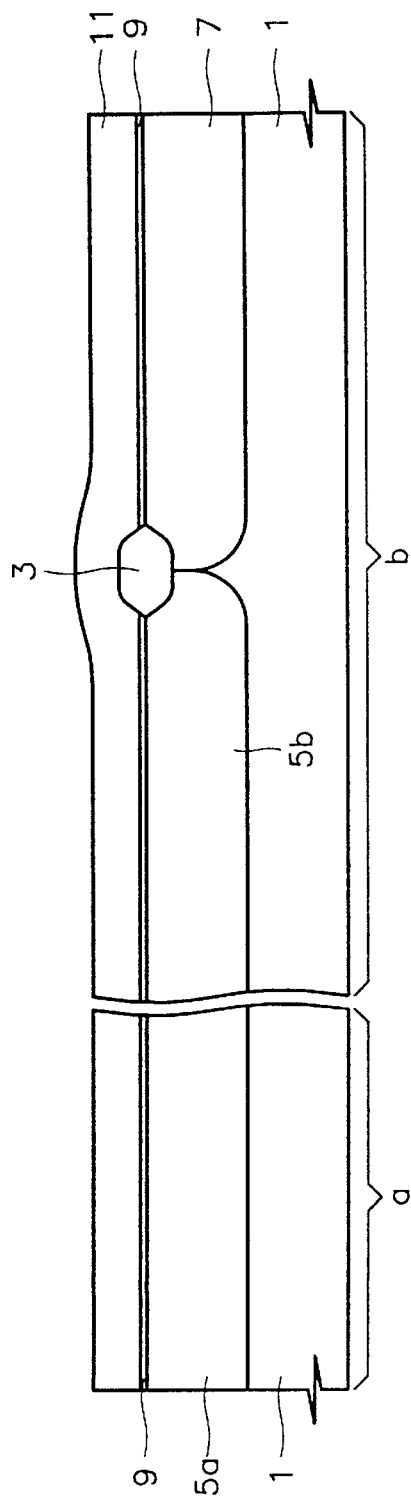
FIGS. 1–3 are cross-sectional views of intermediate structures that illustrate a method of forming an integrated circuit having memory cell arrays and peripheral circuits therein according to the prior art.
Figure 2:
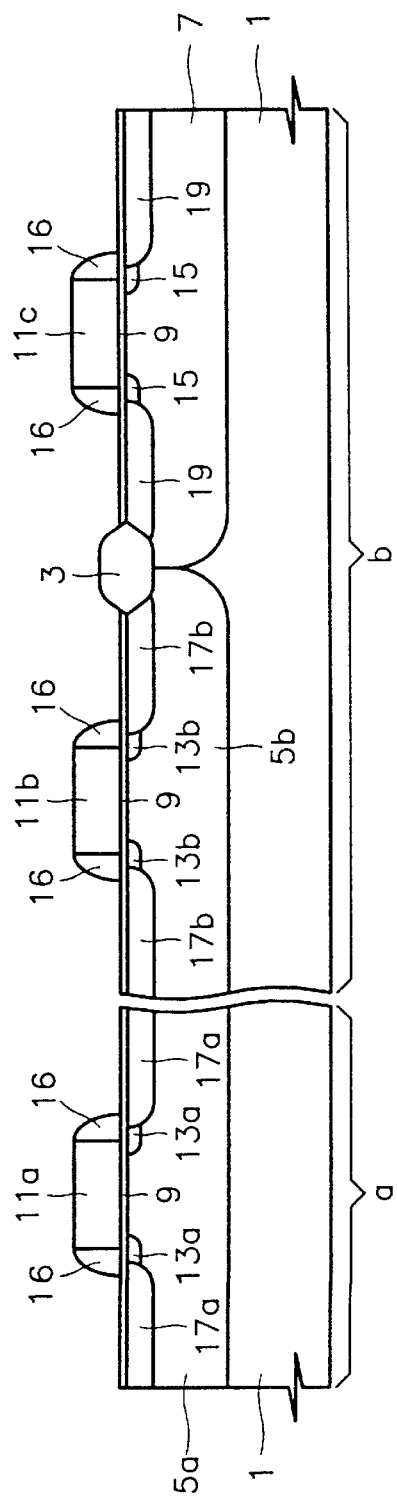
Figure 3:
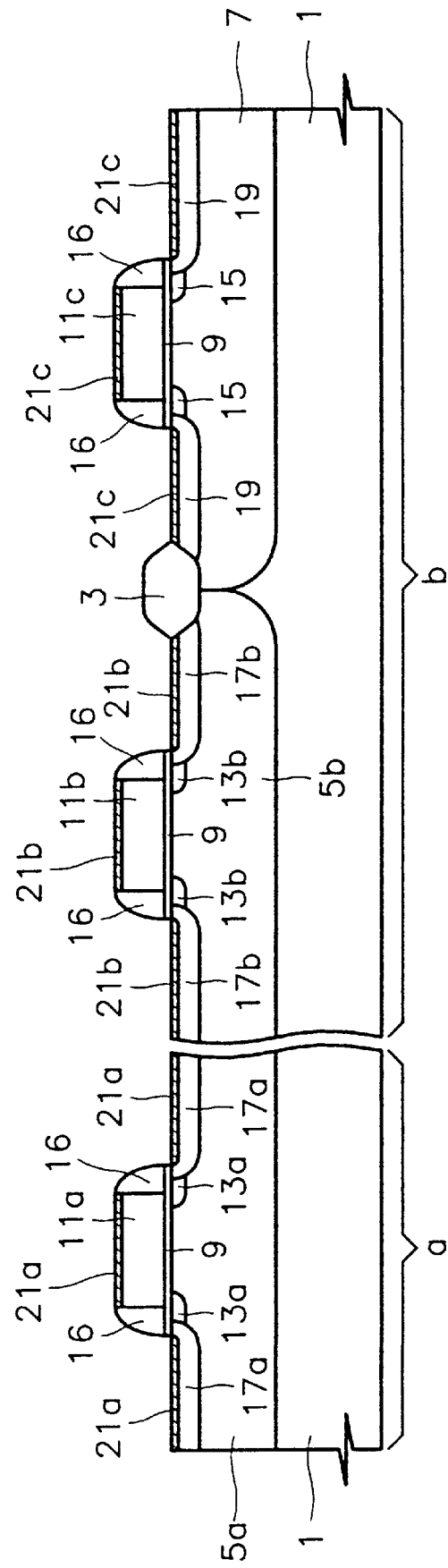
Figure 4:
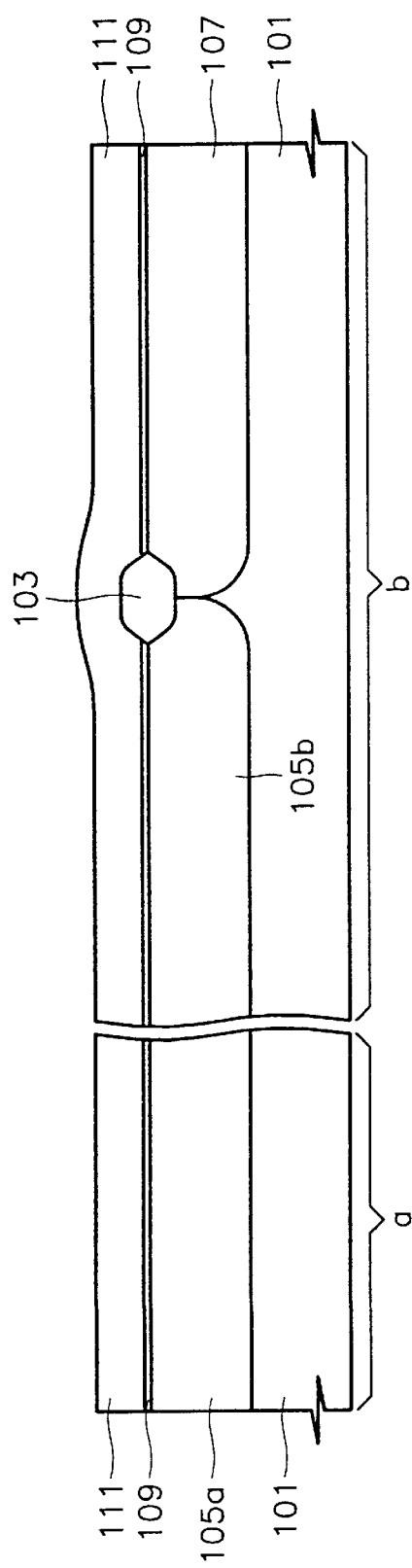

FIG. 4 is a sectional view illustrating a step of forming a gate insulating film 109 and a conductive film 111. First, a P-well region and an N-well region 107 are formed on the main surface of a semiconductor substrate 101 by a conventional twin-well forming process. Here, the P-well region is divided into a first P-well region 105a and a second P-well region 105b. The first P-well region 105a indicates the P-well region formed in the cell array region (a) where memory cells are formed, and the second P-well region 105b and the N-well region 107 indicate the P-well region and N-well region formed in the logic circuit region (b), respectively. Next, an isolation film 103 defining an active region and a field region on a predetermined area of the resultant structure is formed. The gate insulating film 109, e.g., a thermal oxide film, is formed on the active region to a thickness of about 80–200 Å. Here, the isolation film 103 may be formed prior to formation of the twin well. Subsequently, the conductive film 111, preferably an undoped polysilicon film, is formed over the entire surface of the resultant structure having the gate insulating film 109 formed thereon.

Figure 5:
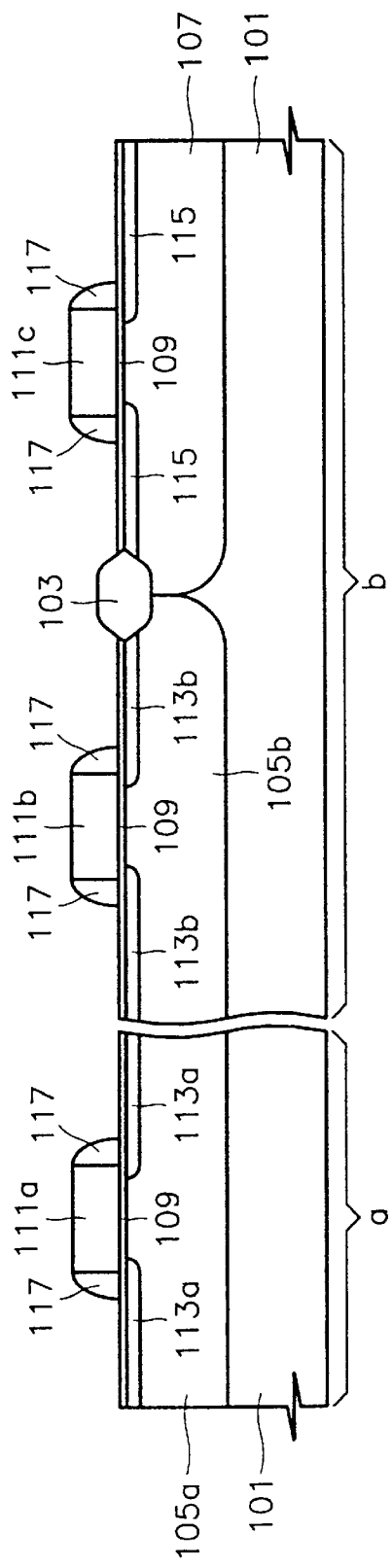

FIG. 5 is a sectional view illustrating steps of forming first through third gate patterns 111a, 111b and 111c, N-type first and second low-concentration source/drain regions 113a and 113b, and a P-type third low-concentration source/drain region 115. In detail, the undoped polysilicon film 111 is patterned to form the first gate pattern 111a on a predetermined area of the gate insulating film 109 formed on the first P-well region 105a. At the same time the second gate pattern 111b and the third gate pattern 111c are formed on a predetermined area of the gate oxide film 9 formed on the second P-well region 105b and the N-well region 107, respectively. Subsequently, N-type impurities, e.g., phosphorus (P) ions, are selectively ion-implanted into the first and second P-well regions 105a and 105b using the first and second gate patterns 111a and 111b, a patterned photoresist layer and the isolation film 103 as ion implantation masks. P-type impurities, e.g., boron (B) ions, are also selectively ion-implanted into the N-well region 107 using the third gate pattern 111c, another patterned photoresist layer and the isolation film 103 as ion implantation masks. Next, the resultant structure is annealed at a predetermined temperature, thereby forming the N-type first and second low-concentration source/drain regions 113a and 113b on the surface of the active region, adjacent both sides of the first and second gate patterns 111a and 111b. The source/drain regions 113a and 113b are formed to have first impurity concentrations in a range between $1.0 \times 10^{17}$–$1.0 \times 10^{18}$/cm$^3$. At the same time, the P-type third low-concentration source/drain region 115 is formed in the active region adjacent both sides of the third gate pattern 111c. The source/drain regions 115 may be formed to have P-type doping concentrations in a range between about $1.0 \times 10^{17}$–$1.0 \times 10^{18}$/cm$^3$. In this case, the first and second gate patterns 111a and 111b are also doped with N-type impurities, and the third gate pattern 111c is doped with P-type impurities.

Here, during the process of forming the first through third low-concentration source/drain regions 113a, 113b and 115, the phosphorus ions may be selectively implanted into only the first P-well region 105a (and the boron ions are not implanted thereinto) so that only the first low-concentration source/drain regions 113a are formed in the first P-well region 105a of the cell array region (a). According to a preferred aspect of the present invention, during the process of forming the first through third low-concentration source/drain regions 113a, 113b and 115, the phosphorus ions may be blanket implanted into the entire surface of the resultant structure having the first through third gate patterns 111a, 111b and 111c formed thereon (but the boron ions are not implanted thereinto) to form the first and second low-concentration source/drain regions 113a and 113b on the first and second P-well regions 105a and 105b, respectively, and at the same time form a N-type low-concentration source/drain region (not shown) having a higher concentration than the N-well region 107, on the surface of the active region, adjacent both sides of the third gate pattern 111c. If the N-type low-concentration source/drain region is formed on the N-well region 107 as described above, the subsequently formed PMOS transistors will have reduced short channel effects. Subsequently, a CVD oxide film or a CVD nitride film is formed on the entire surface of the resultant structure to a thickness of 1000–3000 Å and then is anistropically etched to form spacers 117 at the sidewalls of the first through third gate patterns 111a, 111b and 111c.

FIG. 6 is a sectional view illustrating a step of forming a N-type high-concentration source/drain region 119 and a P-type high-concentration source/drain region 121. First, a first photoresist pattern (not shown) which exposes the top surface of the second P-well region 105b is formed on the resultant structure having the spacers 117 formed thereon. Next, N-type impurities (e.g., arsenic (As) ions) are selectively ion-implanted into the second P-well region 105b using the first photoresist pattern, the second gate pattern 111b, the spacers 117 formed at the sidewalls of the second gate pattern 111b and the isolation film 103 as ion implantation masks, and then the implanted impurities are annealed at a predetermined temperature. In this case, the arsenic ions are implanted at a dose of about $1.0 \times 10^{15} \sim 5.0 \times 10^{15}$ ions/cm$^2$ to form the N-type high-concentration source/drain regions 119 doped at a second impurity concentration higher than the first impurity concentration (e.g., $1.0 \times 10^{19} - 1.0 \times 10^{21}$/cm$^3$). If the N-type high-concentration source/drain regions 119 are formed in this manner, it is possible to prevent the N-type high-concentration source/drain regions 119 from being formed in the first P-well region 105a of the cell array region (a). Therefore, since the ion implantation damage (by As ions) caused by the high dose implant is prevented in the active region of the cell array region (a), crystalline defects such as dislocation in the first low-concentration source/drain regions 113a can be reduced. This decrease in dislocation damage can result in an improvement in the electrical characteristics of storage capacitors ultimately formed in the cell array region (a) and electrically coupled to the low-concentration source/drain regions 113a.

After forming the N-type high-concentration source/drain regions 119, as shown, the second low-concentration source/drain regions 113b remain under the spacers 117 formed at the sidewalls of the second gate pattern 111b, and the second gate pattern 111b is completely doped with N-type impurities. Here, the remaining second low-concentration source/drain regions 113b and the N-type high-concentration source/drain regions 119 in contact therewith constitute LDD source/drain regions of the NMOS transistor of the logic circuit region (b).

Subsequently, the first photoresist pattern is removed and a second photoresist pattern (not shown) is formed to expose the top surface of the N-well region 107. Next, P-type impurities (e.g., boron fluoride (BF$_2$) ions) are selectively implanted into the N-well region 107 using the second photoresist pattern, the third gate pattern 111c, the spacers 117 formed at the sidewalls of the third gate pattern 111c and the isolation film 103 as ion implantation masks. The implanted P-type impurities are then annealed at a predetermined temperature to form the P-type high-concentration source/drain regions 121 doped at a third impurity concentration higher than the first impurity concentration (e.g.,$1.0 \times 10^{19} - 1.0 \times 10^{21}$/cm$^3$), in the third low-concentration source/drain regions 115. If the P-type high-concentration source/drain regions 121 are formed in this manner, as shown, the third low-concentration source/drain regions 115 remain under the spacers 117 formed at the sidewalls of the third gate pattern 111c, and the third gate pattern 111c is completely doped with P-type impurities. Here, the third low-concentration source/drain regions 115 and the P-type high-concentration source/drain regions 121 in contact therewith constitute the LDD source/drain regions of the PMOS transistor of the logic circuit region (b).

FIG. 7 is a sectional view illustrating a step of forming first through third metal silicide films 123a, 123b and 123c using a salicide process. In detail, the gate insulating film 100 is blanket-etched to expose the first low-concentration source/drain regions 113a, N-type high-concentration source/drain regions 119 and P-type high-concentration source/drain regions 121. In this case, the natural oxide film formed on the first through third gate patterns 111a, 111b and 111c is also removed to completely expose the first through third gate patterns 111a, 111b and 111c. Since the thickness of the gate oxide film 109 is much thinner than that of the spacers 117, the spacers 117 change little in height or width during the blanket etching step.

Subsequently, a refractory metal film, e.g., a Ti or Ta film, is formed on the resultant structure to a thickness of several hundred angstroms (Å) and the resultant structure is annealed under a nitrogen atmosphere. If the refractory metal film is annealed in this manner, the first metal silicide film 123a is formed on the first gate pattern 111a and on the first low-concentration source/drain regions 113a. The second metal silicide film 123b is also formed on the second gate pattern 111b and the N-type high-concentration source/drain regions 119 and the third metal silicide film 123c is selectively formed on the third gate pattern 111c and the P-type high-concentration source/drain regions 121. In this case, the refractory metal film formed on the spacers 117 remains in an unreacted state. Next, the unreacted refractory metal film is removed by a chemical solution (e.g., a solution containing ammonium hydroxide) to isolate the gate patterns 111a, 111b and 111c from the source/drain regions on both sides thereof. The thus-formed first metal silicide film 123a constitutes a cell transistor together with the first gate pattern 111a and the first low-concentration source/drain regions 113a. Here, the first gate pattern 111a and the first metal silicide film 123a formed thereon may constitute a word line of the cell array region (a). Since the first through third metal silicide films 123a, 123b and 123c may exhibit a low resistivity of about 13–20 $\mu\Omega$-cm, the RC delay time constant of the word line is reduced and the operational speeds of the NMOS transistors and PMOS transistors formed in the logic circuit region (b) are improved.

Next, although not shown, an interlayer insulating film is formed on the resultant structure and then a bit line is formed and electrically connected to the first metal suicide film 123a on the first low-concentration source region (or the first low-concentration drain region) of the cell transistor. Then, a planarized insulating film is formed over the entire surface of the resultant structure where the bit line is formed, and a cell capacitor comprising a storage electrode connected to the first low-concentration drain region (or the first low-concentration source region) of the cell transistor, a dielectric film and a plate electrode, is formed, thereby completing a DRAM cell.

As described above, according to the embodiment of the present invention, a first metal silicide film can be selectively formed on the gate patterns and on the first low-concentration source/drain regions 113a of the cell transistor. Also, N-type high-concentration source/drain regions can be prevented from being formed in the first low-concentration source/drain regions 113a. Accordingly, the increase in RC delay time of a word line can be prevented and crystalline defects can be prevented from being generated in the first low-concentration source/drain regions of the cell array region. As a result, characteristics related to the retention time of charges stored in the storage electrode of a cell capacitor (i.e., data retention characteristics of a cell) are improved. Also, because a circuit having a longer refresh cycle can be provided, the circuit has lower power consumption requirements. Also, since the first metal silicide film on the first low-concentration source region connected to a bit line has a low resistivity, bit line contact resistance can be reduced. Accordingly, the RC delay time of the bit line can be reduced. As a result, the access time of the information transferred through the bit line can be reduced, thereby improving operational speed of the semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

forming a first conductivity type well region in a memory cell array portion of a semiconductor substrate;

forming first and second conductivity type well regions at spaced locations in a peripheral circuit portion of the semiconductor substrate, adjacent the memory cell array portion of the semiconductor substrate;

forming a first insulated gate electrode on the first conductivity type well region in the memory cell array portion of the semiconductor substrate;

forming second and third insulated gate electrodes on the first and second conductivity type well regions in the peripheral circuit portion of the semiconductor substrate, respectively;

selectively implanting dopants of second conductivity type at a first dose level into first conductivity type well region in the memory cell array portion of the semiconductor substrate, using the first insulated gate electrode as an implant mask, and implanting dopants of second conductivity type at the first dose level into the first conductivity type well region in the peripheral circuit portion of the semiconductor substrate, using the second insulated gate electrode as an implant mask;

selectively implanting dopants of first conductivity type at a second dose level into the second conductivity type well region in the peripheral circuit portion of the semiconductor substrate, using the third insulated gate electrode as an implant mask;

forming sidewall spacers on the second and third insulated gate electrodes;

selectively implanting dopants of second conductivity type at a third dose level, greater than the first dose level, into the first conductivity type well region in the peripheral circuit portion of the semiconductor substrate, using the second insulated gate electrode and respective sidewall spacers as an implant mask, but not into the first conductivity type well region in the memory cell array portion of the semiconductor substrate; and selectively implanting dopants of first conductivity type at a fourth dose level, greater than the second dose level, into the second conductivity type well region in the peripheral circuit portion of the semiconductor substrate, using the third insulated gate electrode and respective sidewall spacers as an implant mask.

2. The method of claim 1, further comprising the step of forming a metal silicide layer on the first, second and third insulated gate electrodes.

3. The method of claim 2, wherein the first, second and third insulated gate electrodes contain first, second and third polycrystalline silicon gates; and wherein said step of forming a metal silicide layer on the first, second and third insulated gate electrodes comprises forming a layer of refractory metal on the first, second and third polycrystalline silicon gates and then annealing the layer of refractory metal to form a metal silicide layer.

4. The method of claim 3, further comprising the step of exposing the annealed layer of refractory metal to a solution containing ammonium hydroxide.

5. The method of claim 3, wherein said step of forming sidewall spacers comprises depositing an insulating layer on the first, second and third insulated gate electrodes and then anisotropically etching the deposited insulating layer.

6. The method of claim 3, wherein said step of selectively implanting dopants of second conductivity type at a first dose level comprises implanting dopants of second conductivity type to form lightly doped source and drain regions having a second conductivity type doping concentration therein in a range between $1 \times 10^{17}$ cm$^{-3}$ and $1 \times 10^{18}$ cm$^{-3}$; and wherein said step of forming a metal silicide layer comprises forming a metal silicide layer on and in electrical contact with the lightly doped source and drain regions.

7. The method of claim 6, further comprising the step of forming a storage capacitor electrode electrically coupled to one of the lightly doped source and drain regions.

8. A method of forming an integrated circuit memory device, comprising the steps of:

forming a first well region of first conductivity type in a memory cell portion of a semiconductor substrate;

forming a second well region of first conductivity type well region in a peripheral circuit portion of the semiconductor substrate extending adjacent the memory cell portion;

forming first and second insulated gate electrodes on the first and second well regions, respectively;

implanting first dopants of second conductivity type at a first dose level into the first and second well regions, using the first and second insulated gate electrodes as an implant mask;

diffusing the first dopants to form first and second source/drain regions adjacent the first and second insulated gate electrodes, respectively;

forming spacers on sidewalls of the first and second insulated gate electrodes;

selectively implanting second dopants of second conductivity type at a second dose level, greater than the first dose level, into the second well region, but not into the first well region, using the second insulated gate electrode and spacers thereon as an implant mask;

diffusing the second dopants into the second source/drain regions;

forming a layer of refractory metal on the first and second insulated gate electrodes and on the first and second source/drain regions having different doping concentrations therein; and converting the layer of refractory metal to a layer of refractory metal silicide.

9. The method of claim 8, wherein said step of diffusing the first dopants comprises diffusing the first dopants to form first and second source/drain regions having a first conductivity type doping concentration therein in a range between $1 \times 10^{17}$ cm$^{-3}$ and $1 \times 10^{18}$ cm$^{-3}$.

10. The method of claim 9, wherein said step of diffusing the second dopants comprises diffusing the second dopants into the second source/drain regions to increase the first conductivity type doping concentration therein to a level in a range between $1 \times 10^{19}$ cm$^{-3}$ and $1 \times 10^{21}$ cm$^{-3}$.

11. The method of claim 10, wherein said step of forming spacers comprises forming electrically insulating spacers of a material selected from the group consisting of silicon dioxide and silicon nitride.

12. The method of claim 10, wherein the first and second insulated gate electrodes comprise respective gate oxide layers having thicknesses in a range between about 80 Å and 200 Å.

13. The method of claim 10, wherein said converting step is followed by the step of exposing the layer of refractory metal silicide to a solution containing ammonium hydroxide.

14. The method of claim 10, further comprising the step of forming a storage capacitor electrode electrically coupled to one of the first source/drain regions.

* * * * *